(12) United States Patent
Lv

(10) Patent No.: US 12,419,006 B2
(45) Date of Patent: Sep. 16, 2025

(54) FAN MOUNTING MECHANISM AND SERVER

(71) Applicant: SUZHOU METABRAIN INTELLIGENT TECHNOLOGY CO., LTD., Jiangsu (CN)

(72) Inventor: Heng Lv, Jiangsu (CN)

(73) Assignee: SUZHOU METABRAIN INTELLIGENT TECHNOLOGY CO., LTD, Suzhou (CN)

( * ) Notice: Subject to any disclaimer, the term of this patent is extended or adjusted under 35 U.S.C. 154(b) by 0 days.

(21) Appl. No.: 19/116,286

(22) PCT Filed: Aug. 9, 2024

(86) PCT No.: PCT/CN2024/111146
§ 371 (c)(1),
(2) Date: Mar. 27, 2025

(87) PCT Pub. No.: WO2025/031489
PCT Pub. Date: Feb. 13, 2025

(65) Prior Publication Data
US 2025/0261330 A1      Aug. 14, 2025

(30) Foreign Application Priority Data

Aug. 9, 2023   (CN) .......................... 202310997626.3

(51) Int. Cl.
*H05K 7/20*       (2006.01)

(52) U.S. Cl.
CPC ..... *H05K 7/20172* (2013.01); *H05K 7/20718* (2013.01)

(58) Field of Classification Search
CPC .......... H05K 7/20172; H05K 7/20718; H05K 7/20727; H05K 7/20581; F04D 29/646; F04D 19/002; G06F 1/20
See application file for complete search history.

(56) References Cited

U.S. PATENT DOCUMENTS

| | | | | |
|---|---|---|---|---|
| 6,040,981 A | * | 3/2000 | Schmitt | G06F 1/18 361/679.48 |
| 6,435,889 B1 | * | 8/2002 | Vinson | H01R 13/745 439/247 |

(Continued)

FOREIGN PATENT DOCUMENTS

| | | |
|---|---|---|
| CN | 208653024 U | 3/2019 |
| CN | 111240421 A | 6/2020 |

(Continued)

*Primary Examiner* — Michael A Matey
(74) *Attorney, Agent, or Firm* — IPro, PLLC

(57) ABSTRACT

In a fan installing mechanism, a base has a first limiting component for limiting the movement of a fan. A flipping member is rotatably connected to the base, and has a second limiting component for limiting the movement of the fan. When the flipping member is in an avoiding state, the flipping member avoids the movement path of the installation of the fan to the base, and the fan is capable of being limiting-fitted to the first limiting component. When the flipping member is in a locking state, the flipping member is flipped relative to the base and the second limiting component is limiting-fitted to the fan, to hinder the fan from disengaging from the base. A locking component is provided between the base and the flipping member, and, when the flipping member is in the locking state, locks the position of the flipping member to the locking state.

18 Claims, 9 Drawing Sheets

(56) References Cited

U.S. PATENT DOCUMENTS

| | | | | |
|---|---|---|---|---|
| 6,556,437 B1* | 4/2003 | Hardin | ............... | H05K 7/20172 361/679.48 |
| 6,587,342 B1* | 7/2003 | Hsu | ............... | G06F 1/20 415/213.1 |
| 6,643,131 B1* | 11/2003 | Huang | ............... | H01L 23/467 257/E23.099 |
| 6,667,882 B2* | 12/2003 | Pauser | ............... | H01L 23/467 257/E23.099 |
| 6,711,013 B2* | 3/2004 | Wobig | ............... | H01L 23/467 361/679.48 |
| 7,623,344 B2* | 11/2009 | Beall | ............... | H05K 7/20727 361/679.48 |
| 7,940,525 B2* | 5/2011 | Letourneau | ............... | H05K 7/20172 361/679.48 |
| 11,454,251 B1* | 9/2022 | Chang | ............... | F04D 19/007 |
| 2006/0203447 A1* | 9/2006 | Kyle | ............... | H05K 7/20172 361/695 |
| 2007/0053159 A1* | 3/2007 | Crippen | ............... | H05K 7/20172 361/695 |
| 2008/0090511 A1* | 4/2008 | Wu | ............... | G06F 1/20 454/184 |
| 2009/0214337 A1* | 8/2009 | Yoshida | ............... | F04D 25/0613 415/214.1 |
| 2015/0173240 A1* | 6/2015 | Peng | ............... | H05K 7/20718 415/214.1 |
| 2016/0258446 A1* | 9/2016 | Tio | ............... | F04D 29/582 |
| 2019/0208670 A1* | 7/2019 | Yu | ............... | F04D 29/646 |
| 2022/0065268 A1* | 3/2022 | Lu | ............... | F04D 19/007 |

FOREIGN PATENT DOCUMENTS

| | | |
|---|---|---|
| CN | 211772274 U | 10/2020 |
| CN | 217825822 U | 11/2022 |
| CN | 116717505 A | 9/2023 |
| JP | H11152950 A | 6/1999 |
| WO | 9946970 A2 | 9/1999 |

* cited by examiner

FAN MOUNTING MECHANISM AND SERVER

CROSS-REFERENCE TO RELATED APPLICATION

The present application claims the priority of the Chinese patent application filed on Aug. 9, 2023 before the Chinese Patent Office with the application number of 202310997626.3 and the title of "FAN MOUNTING MECHANISM AND SERVER", which is incorporated herein in its entirety by reference.

FIELD

The embodiments of the present application relate to the field of servers, and particularly relate to a fan installing mechanism and a server.

BACKGROUND

In the installation of the fan modules of conventional servers, usually a fan support is provided. The fan support is mounted to a bottom plate by using bolts, the fan module is provided with mounting holes, and the fan support is provided with via holes matching with the positions of the mounting holes. In the installation of the fan module, usually the fan module is placed onto the fan support, and subsequently the bolts penetrate the via holes and the mounting holes, so as to install and fix the fan module to the bottom plate.

Although the above-described mode can realize the installation and the fixing of the fan, it entirely has a high component quantity and a complicated structure. Furthermore, in the installation it is required to tighten up the bolts one by one, and the installation and the detaching are time-costing and labor-costing, which affects the efficiency, and increases the cost of labor and components. Furthermore, the conventional fan supports block part of the gas flow, which affects the efficiency of the heat dissipation by the fan modules.

SUMMARY

The embodiments of the present application provide a fan installing mechanism and a server.

According to the first aspect of the present application, there is provided a fan installing mechanism, wherein the fan installing mechanism comprises a base, a flipping member and a locking component. The base has a first limiting component for limiting movement of a fan; the flipping member is rotatably connected to the base, and the flipping member has a second limiting component for limiting the movement of the fan, and has an avoiding state and a locking state; when the flipping member is in the avoiding state, the flipping member avoids a movement path of installation of the fan to the base, and the fan is capable of being limiting-fitted to the first limiting component; and when the flipping member is in the locking state, the flipping member is flipped relative to the base and the second limiting component is limiting-fitted to the fan, to hinder the fan from disengaging from the base; and The flipping member is provided between the base and the locking component, and when the flipping member is in the locking state, the locking component locks a position of the flipping member to the locking state.

In an embodiment, when the flipping member is in the locking state, the first limiting component and the second limiting component are located on two opposite sides of the fan.

In an embodiment, the flipping member and the base are rotatable and translatable relative to each other, and the flipping member further has an intermediate state between the avoiding state and the locking state;
  while the flipping member is being switched from the avoiding state to the intermediate state, the flipping member is flipped relative to the base; and
  while the flipping member is being switched from the intermediate state to the locking state, the flipping member is translated relative to the base.

In an embodiment, a flipping axis of the flipping member and a trajectory line of the translation of the fan to the base are not parallel to each other, and a translation trajectory line of the switching of the flipping member from the intermediate state to the locking state and the trajectory line of the translation of the fan to the base are not perpendicular to each other.

In an embodiment, a connecting line between the first limiting component and the second limiting component and a translation trajectory line of the switching of the flipping member from the intermediate state to the locking state are parallel to each other.

In an embodiment, the flipping member comprises a first section and a second section that are sequentially connected, the first section is rotatably and translatably connected to the base, and the second limiting component and/or the locking component are located at the second section.

In an embodiment, one of the first section and the base is provided with a chute, the other of the first section and the base is provided with a connecting pin, the connecting pin is located inside the chute, and the connecting pin and the chute are translatable relative to each other and rotatable relative to each other.

In an embodiment, the connecting pin and the first limiting component are located on neighboring sides of the base.

In an embodiment, the first section is a plurality of first sections, and each of two ends of the second section is connected to one instance of the first sections, whereby the flipping member is of a structure of a shape of a rectangle without one side.

In an embodiment, the base has a limiting directing component, and the limiting directing component forms a directing channel;
  when the flipping member is in the avoiding state, the first section is located inside the directing channel, and the flipping member is merely capable of translating along a direction of extension of the directing channel; and
  when the first section has exited from the directing channel, the flipping member is capable of being flipped to switch the states.

In an embodiment, the base has a flipping limiting component, and the flipping limiting component is located in a rotation path of the flipping of the flipping member; and
  when the flipping member has been flipped and switched to the locking state, the flipping member and the flipping limiting component stop each other, to control a flipping angle of the flipping member.

In an embodiment, the flipping limiting component is a plurality of flipping limiting components, and on each of two opposite sides in a circumferential direction of a rotation axis of the flipping member is provided one instance of the flipping limiting components; and when the flipping member is in the locking state, the flipping member is stopping-fitted to both of the flipping limiting components on the two sides.

In an embodiment, the second limiting component and the locking component are located on a same one side of the base.

In an embodiment, the locking component comprises a lockout slot and a lockout member, wherein the lockout slot is located on the base;

the lockout member is movably connected to the flipping member; and when the flipping member is in the locking state, the lockout member butts the lockout slot, and the lockout member is located inside the lockout slot and locks a relative position between the flipping member and the base.

In an embodiment, the lockout member and the lockout slot are of a shape-matching non-circular structure; and when the flipping member is in the locking state, shapes of the lockout member and the lockout slot are aligned, the lockout member is protruded into the lockout slot, and the lockout member is rotated to be limiting-fitted to the lockout slot.

In an embodiment, the locking component further comprises a rotary knob, the rotary knob and the lockout member are connected and synchronously rotated, and the lockout member and the rotary knob are located at an inner face and an outer face of a side wall of the flipping member respectively.

In an embodiment, a connecting hole is provided at a bottom of the base, and the base is connected to an external installation frame by the connecting hole.

In an embodiment, the first limiting component and/or the second limiting component is plural, and the first limiting components or the second limiting components are arranged separately along a surface where the first limiting components or the second limiting components are located.

In an embodiment, the flipping member is of a structure of a shape of a rectangle without one side, two ends of the structure of a shape of a rectangle without one side are rotatably and translatably connected to two sides of the base; when the flipping member is in the avoiding state, a plane where the structure of a shape of a rectangle without one side is located is perpendicular to an installation surface of the base; and when the flipping member is in the locking state, the plane where the structure of a shape of a rectangle without one side is located is parallel to the installation surface of the base;

the base has a limiting directing component, and the limiting directing component forms a directing channel; when the flipping member is in the avoiding state, part of the flipping member is located inside the directing channel, and the flipping member is merely capable of translating along a direction of extension of the directing channel; and when the flipping member has exited from the directing channel, the flipping member is capable of being flipped to switch the states;

the flipping member further has an intermediate state between the avoiding state and the locking state; while the flipping member is being switched from the avoiding state to the intermediate state, the flipping member is flipped relative to the base; and while the flipping member is being switched from the intermediate state to the locking state, the flipping member is translated relative to the base; and the base has a flipping limiting component, and the flipping limiting component is located in a rotation path of the flipping of the flipping member; and when the flipping member has been flipped and switched to the intermediate state and the locking state, the flipping member and the flipping limiting component stop each other, to control a flipping angle of the flipping member.

According to the second aspect of the present application, there is provided a server, wherein the server comprises a fan and the fan installing mechanism stated above, and the fan is installed to the fan installing mechanism.

In the technical solutions of the present application, by providing the rotatable flipping member and the fitting between the locking component and the base, a fan installing mechanism that can lock and unlock a fan is formed. The flipping member has the locking state and the avoiding state, and the flipping member can complete the switching between the avoiding state and the locking state by actions such as rotation. While the fan is being mounted to the fan installing mechanism, the flipping member is in the avoiding state, at which point, because of the avoiding of the flipping member, the fan can smoothly enter the installation region of the base. Moreover, after the fan has entered the installation region of the base, the fan is fitted to the first limiting component of the base, to preliminarily limit the fan to the base, at which point the fan is not completely limited, and can still be removed from the base. Moreover, after the fan has been fitted to the first limiting component, i.e., after the preliminary placement of the fan has been completed, the flipping member is rotated to be switched from the original avoiding state to the locking state, and the second limiting component of the flipping member is limiting-fitted to the fan, at which point the movement path of the reverse movement of the fan to exit from the base is blocked by the flipping member, and is also blocked by the second limiting component. Accordingly, by the cooperation between the first limiting component and the second limiting component, the fan can be locked to the base, to realize the installation of the fan to the base. After the flipping member has been flipped to the locking state, the locking component acts. The locking component causes that the flipping member cannot switch back to the avoiding state, so as to lock the position of the flipping member, thereby fixedly installing the fan to the fan installing mechanism. When inspection and repairing are required, it is merely required to unlock the locking component, and reversely rotate the flipping member, whereby the limiting to the fan can be released, and the fan can be taken out. By using the above-described configuring mode, in the installation, it is merely required to place the fan onto the base, subsequently flip the flipping member, and operate the locking component to lock the flipping member, and it is not required to tighten up the screws one by one. The whole process is convenient and quick, greatly increases the efficiency of the installation, facilitates the maintenance, and reduces the labor cost. Furthermore, the above-described mechanism has a simple structure and a low processing cost, which facilitates to reduce the processing cost. Moreover, the blocking by the flipping member to the fan is very small, and does not affect the blowing by the fan, which facilitates to improve the effect of the heat dissipation.

Figure 1:
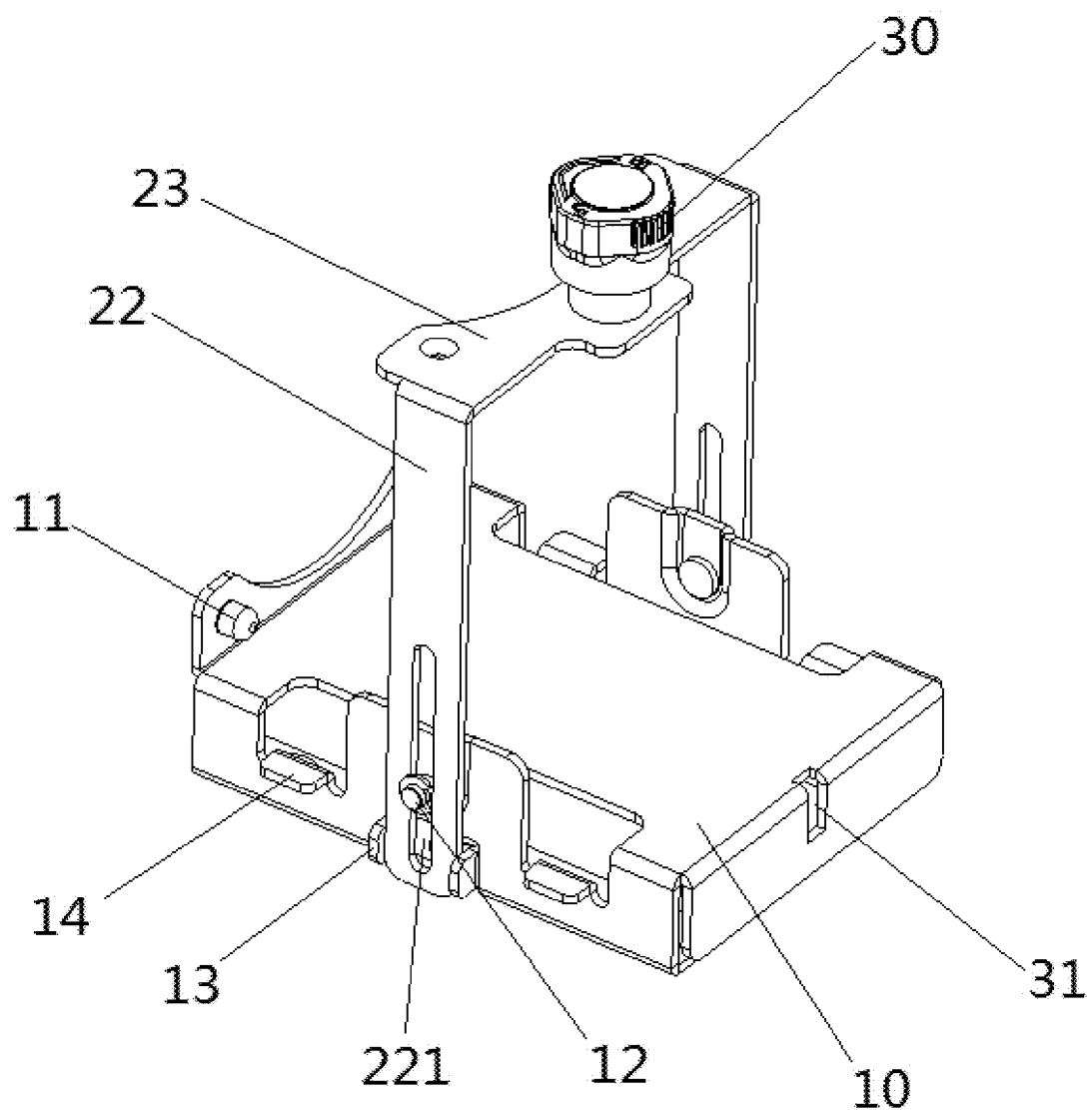
FIG. 1 is a schematic structural diagram of a fan installing mechanism according to the first embodiment of the present application.

The drawings contain the following reference numbers: 10: base; 11: first limiting component; 12: connecting pin; 13: limiting directing component; 131: directing channel; 14: flipping limiting component; 15: connecting hole; 20: flipping member; 21: second limiting component; 22: first section; 221: chute; 23: second section; 30: locking component; 31: lockout slot; 32: lockout member; and 33: rotary knob.

DETAILED DESCRIPTION

It should be noted that, subject to the avoiding of any conflict, the embodiments and the features of the embodiments of the present application may be combined. The present application will be described in detail below with reference to the drawings and the embodiments.

It should be noted that, unless otherwise indicated, all of the technical and scientific terminologies used herein have the same meanings as those usually comprehended by a person skilled in the art that the present application pertains to.

In the present application, unless stated otherwise, the used words of orientation, such as "upper", "lower", "top" and "bottom", generally refer to the orientations shown in the drawings, or refer to the case in which the components themselves are in the vertical, perpendicular or gravity direction. Likewise, in order to facilitate the comprehension and the description, "inner" and "outer" refer to the interior and the exterior with respect to the contours of the components themselves. However, those words of orientation are not intended to limit the present application.

In order to solve the problem of time costing and labor costing in the installation of fan modules in the related art, the present application provides a fan installing mechanism and a server. The server has a fan and the fan installing mechanism described below, and the fan is installed to the fan installing mechanism.

The First Embodiment

The fan installing mechanism shown in FIGS. 1 to 9 comprises a base 10, a flipping member 20 and a locking component 30. The base 10 has a first limiting component 11 for limiting the movement of a fan. The flipping member 20 is rotatably connected to the base 10, and the flipping member 20 has a second limiting component 21 for limiting the movement of the fan, and has an avoiding state and a locking state. When the flipping member 20 is in the avoiding state, the flipping member 20 avoids the movement path of the installation of the fan to the base 10, and the fan is capable of being limiting-fitted to the first limiting component 11. When the flipping member 20 is in the locking state, the flipping member 20 is flipped relative to the base 10 and the second limiting component 21 is limiting-fitted to the fan, to hinder the fan from disengaging from the base 10. The flipping member 20 is provided between the base 10 and the locking component 30, and when the flipping member 20 is in the locking state, the locking component 30 locks the position of the flipping member 20 to the locking state.

In the present embodiment, by providing the rotatable flipping member 20 and the fitting between the locking component 30 and the base 10, a fan installing mechanism that can lock and unlock a fan is formed. The flipping member 20 has the locking state and the avoiding state, and the flipping member 20 can complete the switching between the avoiding state and the locking state by actions such as rotation. While the fan is being mounted to the fan installing mechanism, the flipping member 20 is in the avoiding state, at which point, because of the avoiding of the flipping member 20, the fan can smoothly enter the installation region of the base 10. Moreover, after the fan has entered the installation region of the base 10, the fan is fitted to the first limiting component 11 of the base 10, to preliminarily limit the fan to the base 10, at which point the fan is not completely limited, and can still be removed from the base 10. Moreover, after the fan has been fitted to the first limiting component 11, i.e., after the preliminary placement of the fan has been completed, the flipping member 20 is rotated to be switched from the original avoiding state to the locking state, and the second limiting component 21 of the flipping member 20 is limiting-fitted to the fan, at which point the movement path of the reverse movement of the fan to exit from the base 10 is blocked by the flipping member 20, and is also blocked by the second limiting component 21. Accordingly, by the cooperation between the first limiting component 11 and the second limiting component 21, the fan can be locked to the base 10, to realize the installation of the fan to the base 10. After the flipping member 20 has been flipped to the locking state, the locking component 30 acts. The locking component 30 causes that the flipping member 20 cannot switch back to the avoiding state, so as to lock the position of the flipping member 20, thereby fixedly installing the fan to the fan installing mechanism. When inspection and repairing are required, it is merely required to unlock the locking component 30, and reversely rotate the flipping member 20, whereby the limiting to the fan can be released, and the fan can be taken out. By using the above-described configuring mode, in the installation, it is merely required to place the fan onto the base 10, subsequently flip the flipping member 20, and operate the locking component 30 to lock the flipping member 20, and it is not required to tighten up the screws one by one. The whole process is convenient and quick, greatly increases the efficiency of the installation, facilitates the maintenance, and reduces the labor cost. Furthermore, the above-described mechanism has a simple structure and a low processing cost, which facilitates to reduce the processing cost. Moreover, the blocking by the flipping member 20 to the fan is very small, and does not affect the blowing by the fan, which facilitates to improve the effect of the heat dissipation.

Figure 6:
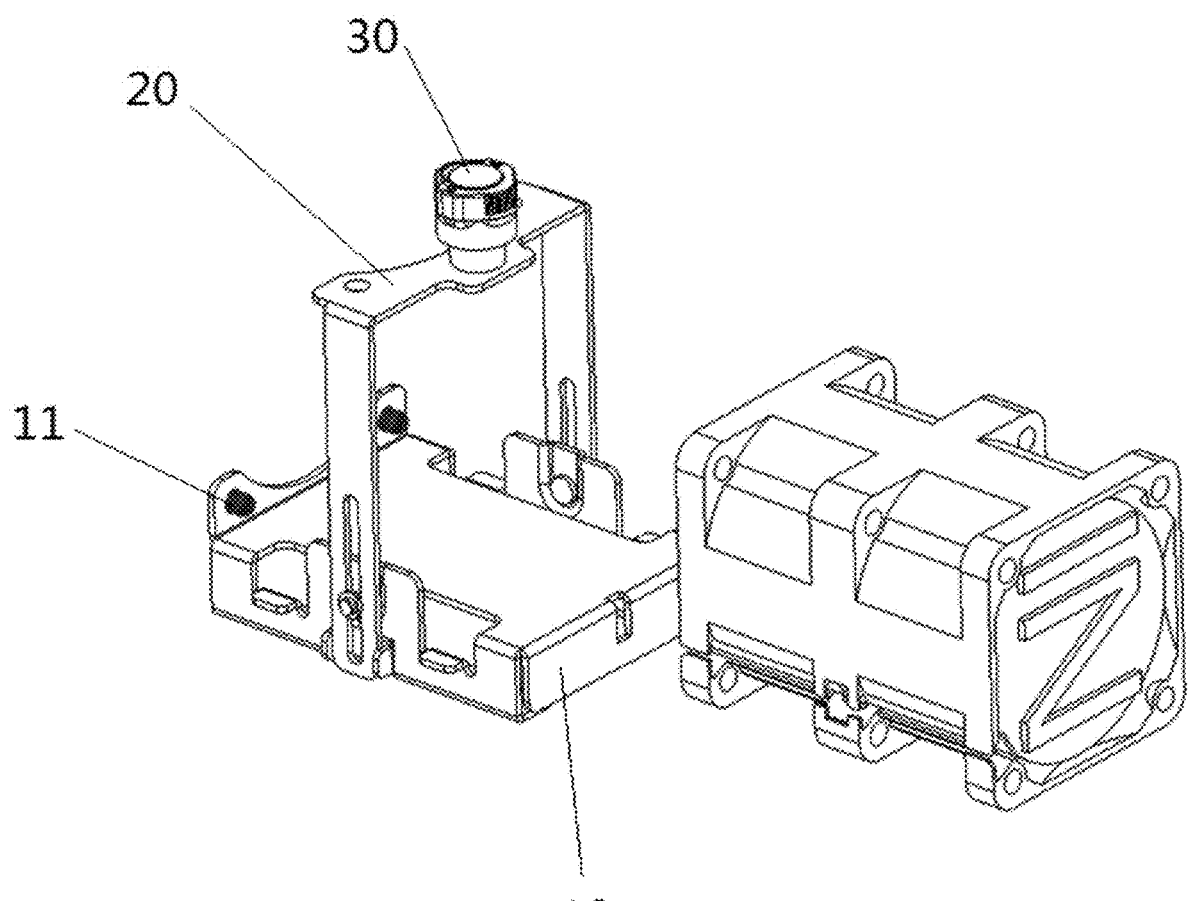
FIG. 6 is a schematic structural diagram when the fan installing mechanism in FIG. 1 and a fan are aligned for installation.
Figure 7:
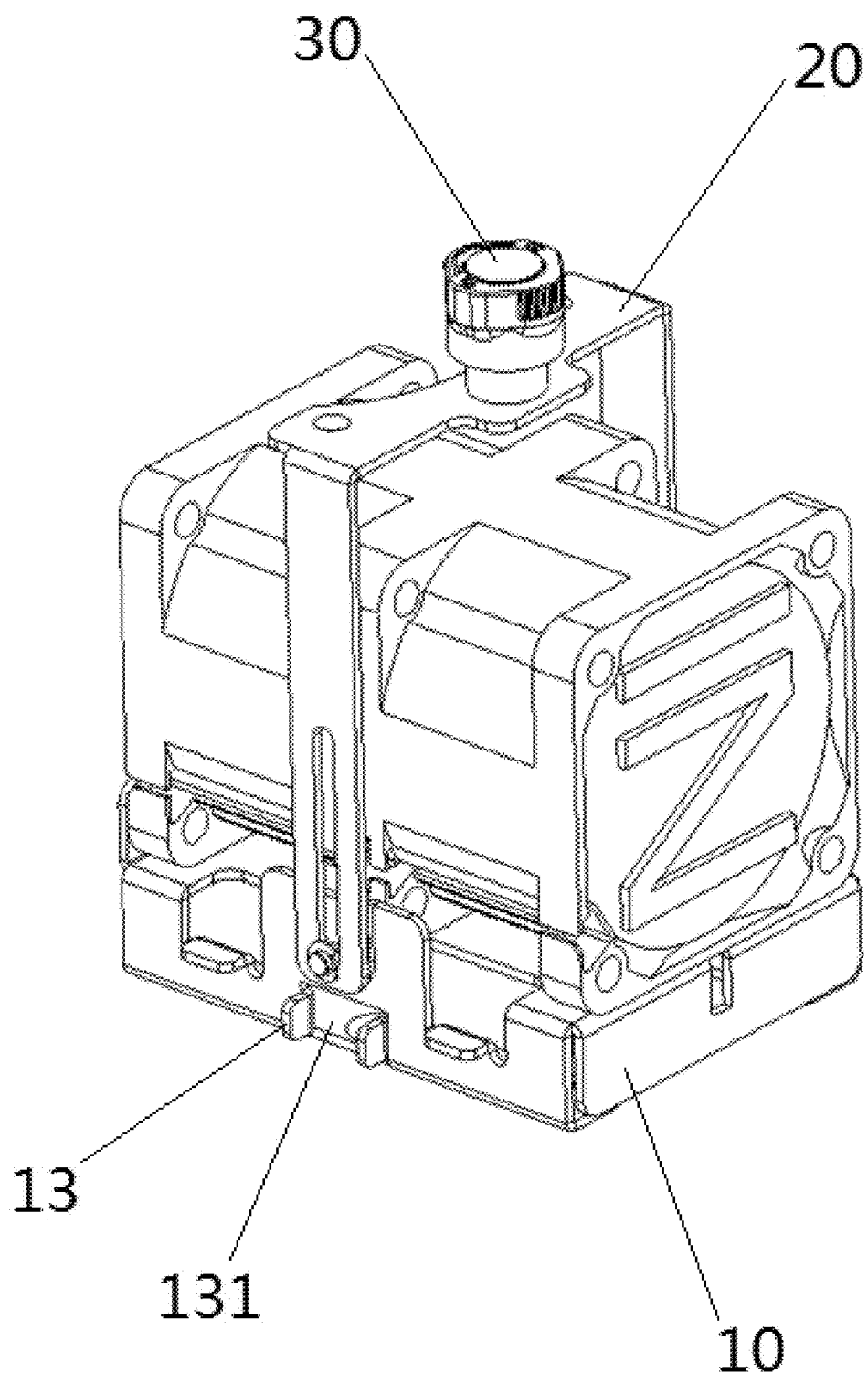
FIG. 7 is a schematic structural diagram when the fan in FIG. 1 has been placed to the base and the flipping member is in the avoiding state.
Figure 8:
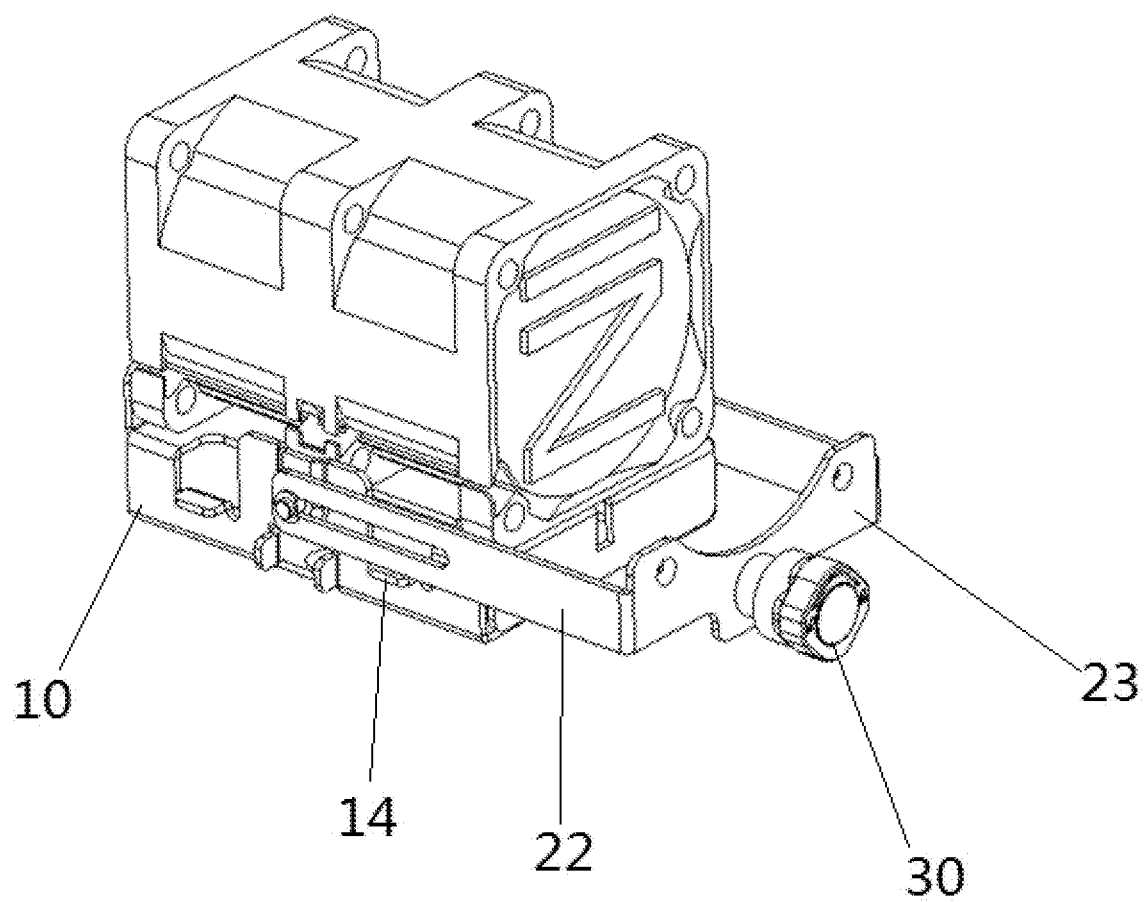
FIG. 8 is a schematic structural diagram when the flipping member in FIG. 1 has been flipped to the intermediate state.

In the present embodiment, as shown in FIG. 6, the fan that is required to be installed and fixed has an overall structure that is similar to a regular tetragonal prism, and the axis of the regular tetragonal prism is horizontal, and is substantially parallel to the surface of the base 10. Mounting holes are provided at the four corners of the end face of the regular tetragonal prism. The axes of the mounting holes are parallel to the axis of the regular tetragonal prism, and the mounting holes are blind holes. The positions of the four openings are symmetrical and the sizes are substantially equal. The mounting holes are components of the fan itself, and cooperate with the via holes in the support in the conventional installation mode, and the present embodiment still utilizes the mounting holes, and employs the mode in which the first limiting component 11 and the second limiting component 21 cooperate with the mounting holes. Accordingly, it is not required to change the structure of the fan, and the support may be directly replaced, which facilitates the reconstruction.

Figure 2:
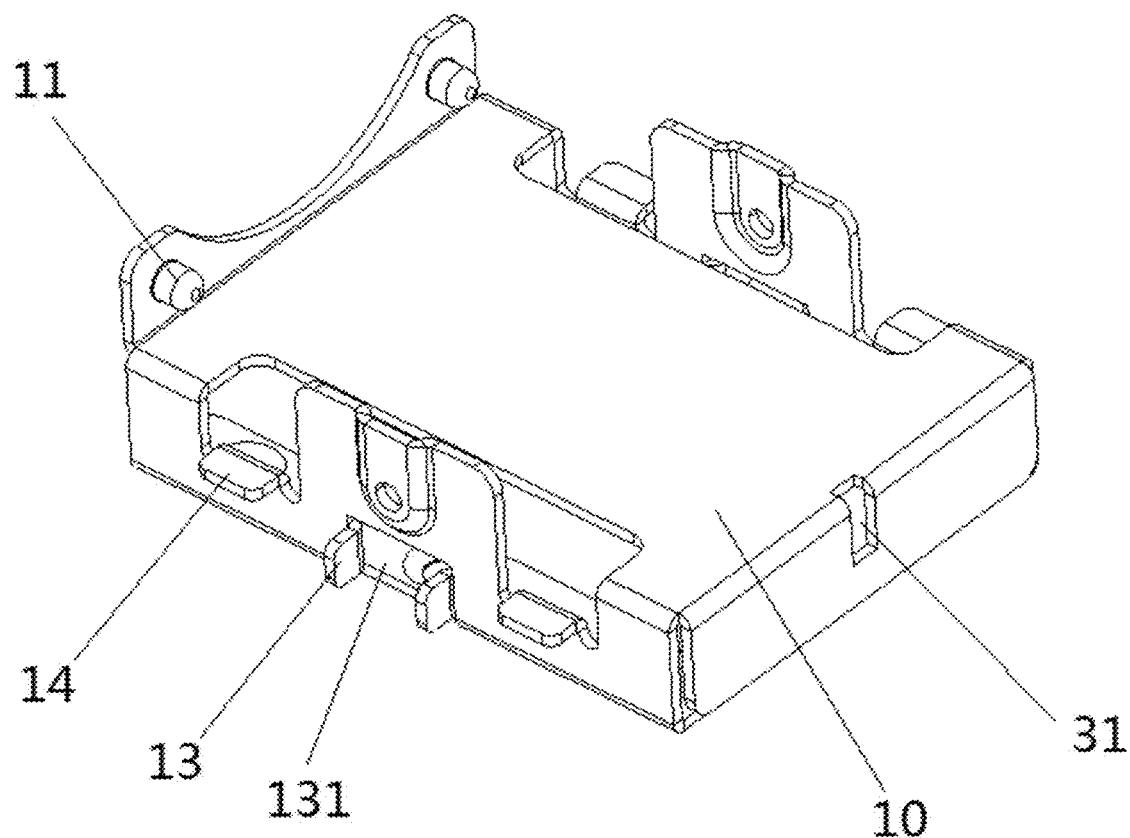
FIG. 2 is a schematic structural diagram of the base in FIG. 1.
Figure 5:
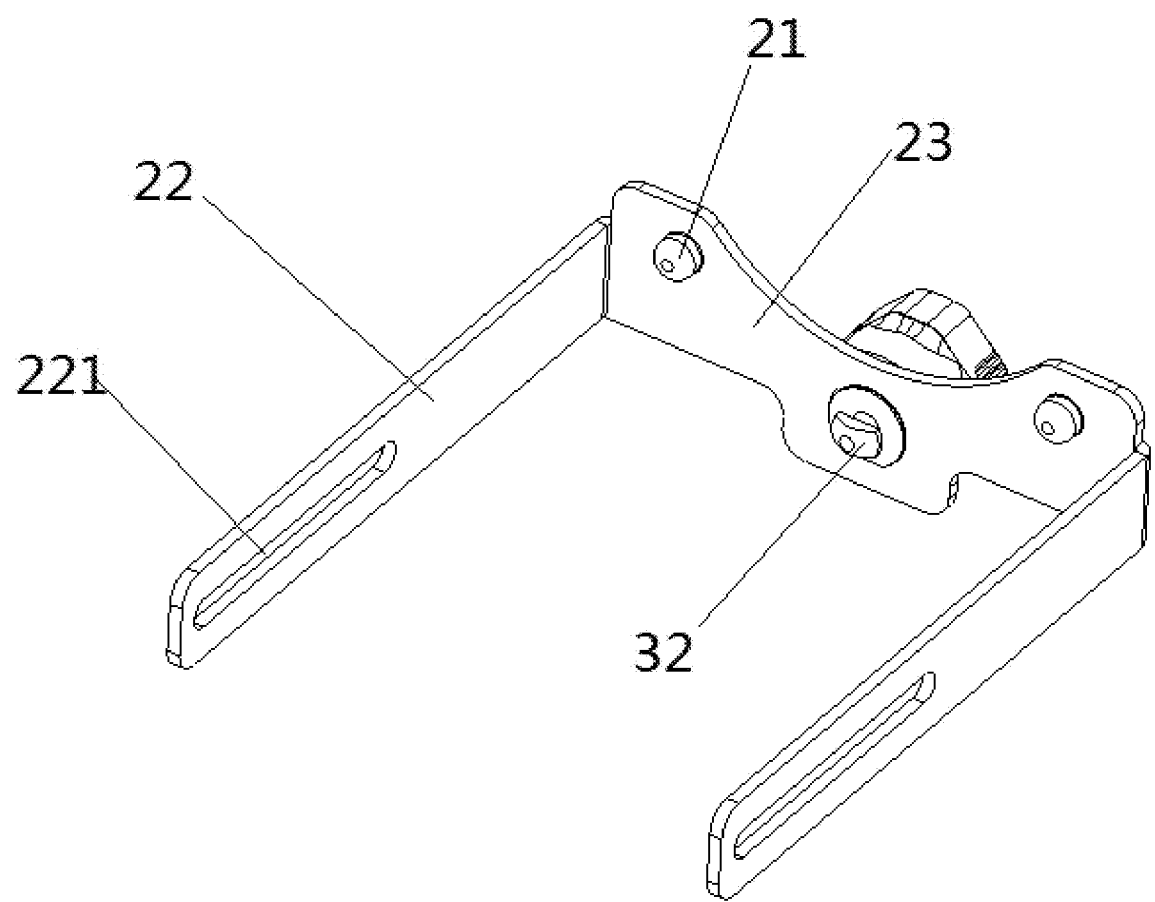
FIG. 5 is a schematic structural diagram of the flipping member in FIG. 1 in another perspective.

As shown in FIGS. 2 and 5, based on the above-described structure of the mounting hole of the fan, both of the second limiting component 21 located on the flipping member 20 and the first limiting component 11 located on the base 10 according to the present embodiment may use a protruding-column structure, and the axes of the protruding-column structures are parallel to the surface of the base 10. Furthermore, the present embodiment employs the configuration in which, when the flipping member 20 is in the locking state, the first limiting component 11 and the second limiting component 21 are located on the two opposite sides of the fan. Accordingly, when the fan is being, along the surface of the base 10, placed into the installation region over the base 10, the first limiting component 11 can be protruded into the mounting hole of one end face, so as to limit all of the movements in the other directions than the exiting out of the installation region in the reverse direction of the fan. Moreover, when the flipping member 20 is in the locking state, the second limiting component 21 is protruded into the mounting hole of the other end face, so as to also limit the movement of the exiting out of the installation region in the reverse direction of the fan. Accordingly, the locking of the movement of the fan is realized, to ensure the effect that the fan is stably fixed to the base 10.

It should be noted that the above-described two sides refer to the two sides of the base 10 along the translation trajectory line of the mounting into the base 10 of the fan, i.e., the two sides of the two end faces of the fan. Accordingly, the first limiting component 11 and the second limiting component 21 may be fitted to the mounting holes in the two end faces of the fan, to realize the limiting on the two sides, to ensure the effect of the fixing.

Certainly, the first limiting component 11 and the second limiting component 21, besides being provided on the two opposite sides, may also be provided on neighboring sides. Accordingly, the mode of the fitting between the fan and the first limiting component 11 maintains unchanged, and, because the second limiting component 21 is on the neighboring side of the first limiting component 11, in this case, the stopping of the movement of the exiting out of the installation region in the reverse direction of the fan is realized by stopping fitting between the side face of the second limiting component 21 and the circumferential side face of the mounting hole. Certainly, the second limiting component 21 may also be provided on both of the neighboring side and the opposite side of the first limiting component 11.

Figure 3:
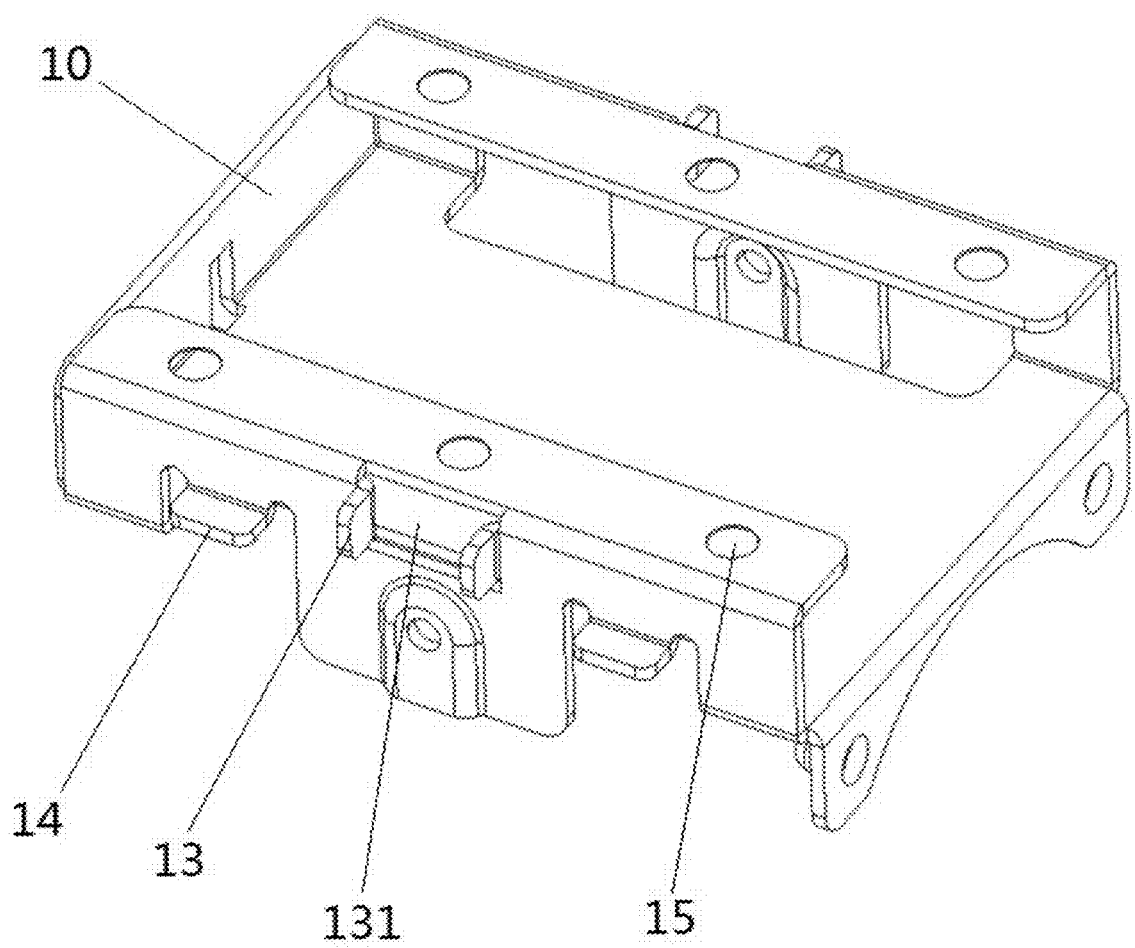
FIG. 3 is a schematic structural diagram of the base in FIG. 1 in another perspective.

As shown in FIGS. 2 and 3, in the present embodiment, the base 10 is of a flat-shaped structure having a certain thickness, and is of the structure of a cuboid. Its upper surface is the surface for the placement of the fan, and the surface is the surface for forming the installation region. Because usually the fan has a high length, in the present embodiment a mounting plate that protrudes upwardly is provided at the shorter side of the base 10, and the first limiting component 11 is located on the mounting plate. Accordingly, the fan, when has slid in the direction parallel to the surface of the base 10 into the installation region, can be fitted to the first limiting component 11. Because the base 10 according to the present embodiment is merely required to serve to support the fan, and has very small blocking to the side face of the fan, the affection on the gas flow of the fan may be reduced, to ensure the effect of the heat dissipation by the fan.

Certainly, the base 10 may employ the structure of a hollow cube, and is opened at one of the side faces and the top face, to realize the avoiding of the flipping member 20 and the mounting of the fan.

As shown in FIGS. 6 to 9, in the present embodiment, not only the flipping member 20 and the base 10 are rotatable, they have a relation of relative translation therebetween. Taking into consideration that, when the flipping member 20 is directly flipped to the locking state from the avoiding state, it is inconvenient for the second limiting component 21 to be limiting-fitted to the mounting hole in the fan, the flipping member 20 according to the present embodiment further has an intermediate state between the avoiding state and the locking state, wherein the intermediate state, as a transition state between the avoiding state and the locking state, serves to transit. Particularly, when it is required to lock the fan, the flipping member 20 is flipped from the avoiding state. In the flipping, the second limiting component 21 cannot be directly protruded into the mounting hole. Therefore, the flipping member 20 cannot be directly flipped to the locking state, and the flipping member 20 is firstly flipped relative to the base 10 to the intermediate state. At this point, the second limiting component 21 is switched from a position not aligned with the mounting hole to a position aligned with the mounting hole; however, at this point, they are merely aligned, and the second limiting component 21 has not protruded into the mounting hole. Subsequently, the flipping member 20 is horizontally translated relative to the base 10, the flipping member 20 is switched from the intermediate state to the locking state, the second limiting component 21 gradually approaches and protrudes into the mounting hole, till the flipping member 20 has translated to the locking state, and the second limiting component 21 has protruded in the mounting hole to complete the limiting. Accordingly, by using the intermediate state, a convenient butting between the mounting hole and the second limiting component 21 may be realized. Certainly, if the second limiting component 21, in the flipping of the flipping member 20, can directly butt with the mounting hole, then the intermediate state may not be provided.

Optionally, the flipping axis of the flipping member 20 and the trajectory line of the translation of the fan to the base 10 are not parallel to each other. In the present embodiment they are perpendicular. Accordingly, although both of them are parallel to the surface of the base 10, the directions of them are not the same, and no matter when the fan is being placed or the flipping member 20 is being flipped, the flipping member 20 and the fan do not interference. The translation trajectory line of the switching of the flipping member 20 from the intermediate state to the locking state and the trajectory line of the translation of the fan to the base 10 are not perpendicular to each other. In the present embodiment they are parallel. Accordingly, while the flipping member 20 is being switched from the intermediate state to the locking state, the second limiting component 21 can gradually approach and protrude into the mounting hole, to realize the fitting to the mounting hole. The connecting line between the first limiting component 11 and the second limiting component 21 and the translation trajectory line of the switching of the flipping member 20 from the intermediate state to the locking state are parallel to each other. In other words, the upper surface of the base 10, the trajectory line of the sliding of the fan to the base 10, the connecting line between the first limiting component 11 and the second limiting component 21, and the trajectory line of the switching of the flipping member 20 from the intermediate state to the locking state are parallel to each other, and the latter three are perpendicular to the flipping axis of the flipping member 20. More particularly, all of the trajectory line of the sliding of the fan to the base 10, the connecting line between the first limiting component 11 and the second limiting component 21, and the trajectory line of the switching of the flipping member 20 from the intermediate state to the locking state are horizontal and extend along the longer sides of the base 10, and the flipping axis of the flipping member 20 is also horizontal but extends along the shorter sides of the base 10. Certainly, the particular configuration is not limited to the above mode according to the present embodiment, and may be adjusted correspondingly according to demands.

Figure 4:
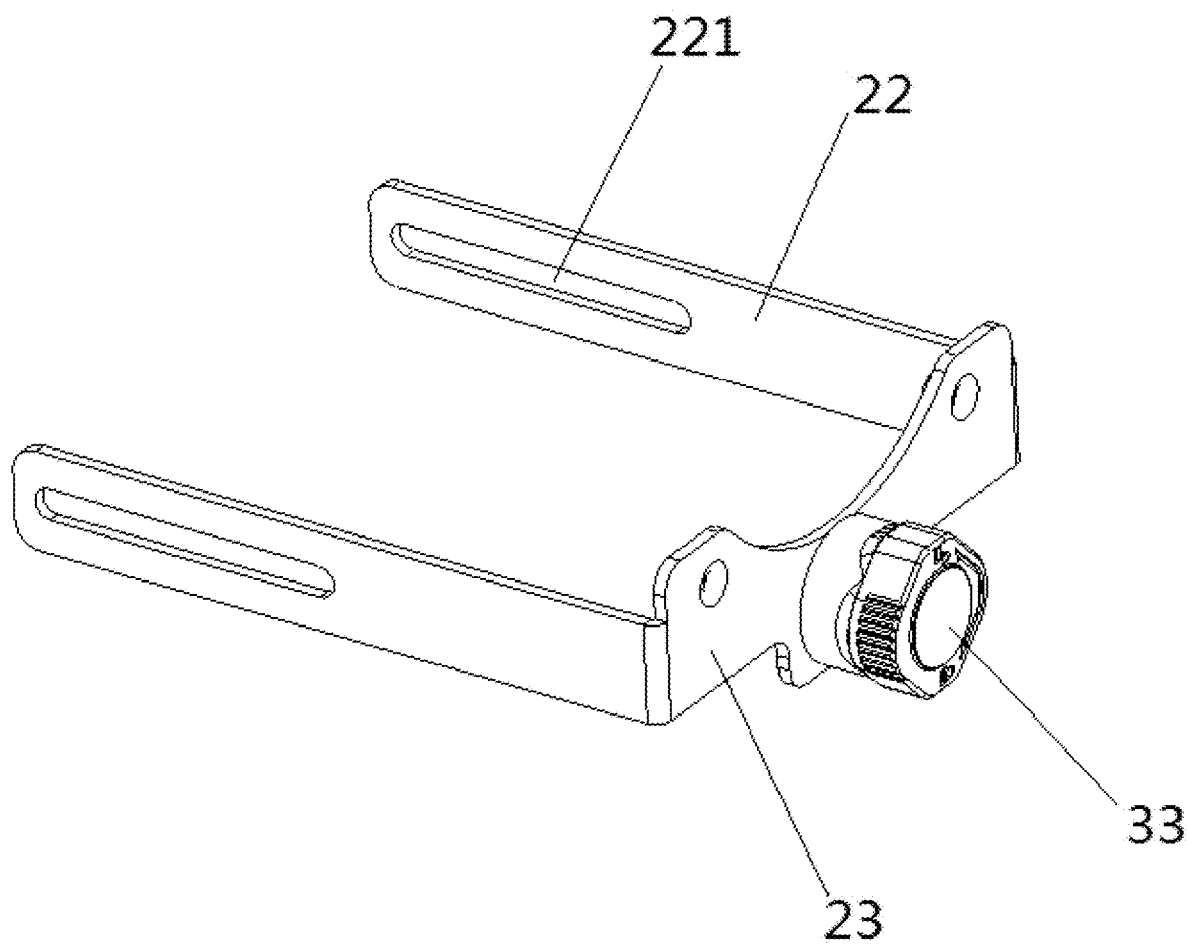
FIG. 4 is a schematic structural diagram of the flipping member in FIG. 1.

As shown in FIGS. 4 and 5, in the present embodiment, the flipping member 20 comprises a first section 22 and a second section 23 that are sequentially connected, the first section 22 is rotatably and translatably connected to the base 10, and the second limiting component 21 and/or the locking component 30 are located at the second section 23.

Particularly, the first section 22 and the second section 23 according to the present embodiment form an L-shaped structure. Accordingly, the first section 22 is located at the longer side of the base 10, and the second section 23 can be fitted to the shorter side of the base 10. Because the flipping member 20 according to the present embodiment is required to rotate, in the present embodiment a protruding section that extends upwardly by a small distance is provided at the side face of the longer side of the base 10, and the end of the first section 22 that is farther from the second section 23 is rotatably and translatably connected to the protruding section. In the present embodiment, the rotatable and translatable connection between them is realized in the mode of the fitting between a chute 221 and a pin roll. In other words, the first section 22 is provided with a chute 221, and the chute 221 extends in the length direction of the first section 22. Moreover, the protruding section is provided with a penetrating connecting pin 12, C-shaped buckle and so on, the connecting pin 12 is fixed to the protruding section, and at the same time the connecting pin 12 penetrates the chute 221. Therefore, the first section 22 and the protruding section cannot only be translated along the chute 221, but also can be rotated around the connecting pin 12. Moreover, the second section 23 serves to mount the components, and both of the second limiting component 21 and the locking component 30 are provided at the second section 23.

Because the protruding section is located on the side of the longer side of the base 10, the connecting pin 12 is naturally also located on the side of the longer side of the base 10. Accordingly, the connecting pin 12 and the first limiting component 11 are located on the neighboring sides of the base 10; in other words, the first limiting component 11 and the second limiting component 21 are located on the sides of the two shorter sides of the base 10, and the connecting pin 12 and the chute 221 are located on the side of the longer side of the base 10. Accordingly, when the flipping member 20 is in the avoiding state, the first section 22 is perpendicular to the upper surface of the base 10, and the second section 23 is located above the base 10 at a large distance, whereby the flipping member 20 can avoid the path of the sliding of the fan to the base 10. Moreover, when the flipping member 20 is in the locking state, the first section 22 is flipped to be parallel to the longer side, and the second section 23 is located at the shorter side, which can realize the locking of the fan.

In order to ensure the stability of the flipping of the flipping member 20, a plurality of first sections 22 may be provided according to demands. In the present embodiment two first sections 22 are provided, and the two first sections are located at the two ends of the second section 23. Accordingly, the flipping member 20 forms an overall structure of a shape of a rectangle without one side. The two ends of the structure of a shape of a rectangle without one side are connected to the two shorter sides of the base 10, and the middle space of the structure of a shape of a rectangle without one side forms the installation region with the base 10.

As shown in FIGS. 1 and 2, in the present embodiment, because the flipping member 20 has the two movement modes of rotation and vertical translation in the avoiding state, the base 10 according to the present embodiment is further provided with a limiting directing component 13, and the limiting directing component 13 forms a directing channel 131. When the flipping member 20 is in the avoiding state, the first section 22 is located inside the directing channel 131. Accordingly, the flipping member 20 is merely capable of translating along the direction of extension of the directing channel 131; in other words, it can merely be vertically translated but cannot be rotated. Merely when the first section 22 has exited from the directing channel 131, the flipping member 20 is capable of being flipped to switch the states. Accordingly, by the cooperation by the limiting directing component 13 with the movement of the flipping member 20 in the avoiding state, the flipping member 20 can automatically maintain in the avoiding state. In other words, when having no action, the flipping member 20 hangs by the effect of the gravity of itself, and the connecting pin 12 is located at the topmost end of the chute 221. At this point, part of the first section 22 is definitely located inside the directing channel 131, and the limiting by the limiting directing component 13 causes that the flipping member 20 cannot be rotated, thereby maintaining in the avoiding state, which may facilitate the personnel to place the fan in place. Moreover, when it is required to flip, the operator manually lifts the flipping member 20, to cause the flipping member 20 to translate upwardly, till the first section 22 has completely exited from the directing channel 131. At this point, the limiting directing component 13 no longer serves to limit the rotation of the flipping member 20, and the flipping member 20 can be flipped and switched to the intermediate state and the locking state.

The limiting directing component 13 according to the present embodiment is provided under the connecting pin 12, and is in the form of bumps. In other words, two bumps are provided at the middle part of the side face of the longer side of the base 10, and the two bumps are arranged separately in the direction of the longer side. Accordingly, the two bumps form the directing channel 131 therebetween, and the size of the directing channel 131 is substantially equal to the width of the first section 22, whereby the directing channel 131 can be for the first section 22 to protrude into and serve to limit the first section 22. Moreover, because two first sections 22 are provided, in the present embodiment the sides of both of the two longer sides of the base 10 are provided with the limiting directing component 13. Certainly, the particular structural form of the limiting directing component is not limited to the above-described mode according to the present embodiment, and may also employ other modes. For example, a vertically extending guide rail is provided on the side of the longer side, and the first section 22 is provided inside the guide rail so as to replace the function of the directing channel 131.

In the present embodiment, the base 10 further has a flipping limiting component 14, and the flipping limiting component 14 is located in the rotation path of the flipping of the flipping member 20. When the flipping member 20 has been flipped and switched to the locking state, the flipping member 20 and the flipping limiting component 14 stop each other. The flipping limiting component 14 mainly serves to control the flipping angle of the flipping member 20, thereby preventing the flipping member 20 from flipping excessively, and can have the effect of assisting locking the flipping member 20 after the fan has been locked. In other words, while the locking component 30 is locking the flipping member 20, the flipping limiting component 14 also serves to limit the flipping of the flipping member 20, thereby ensuring the reliability of the locking.

Figure 9:
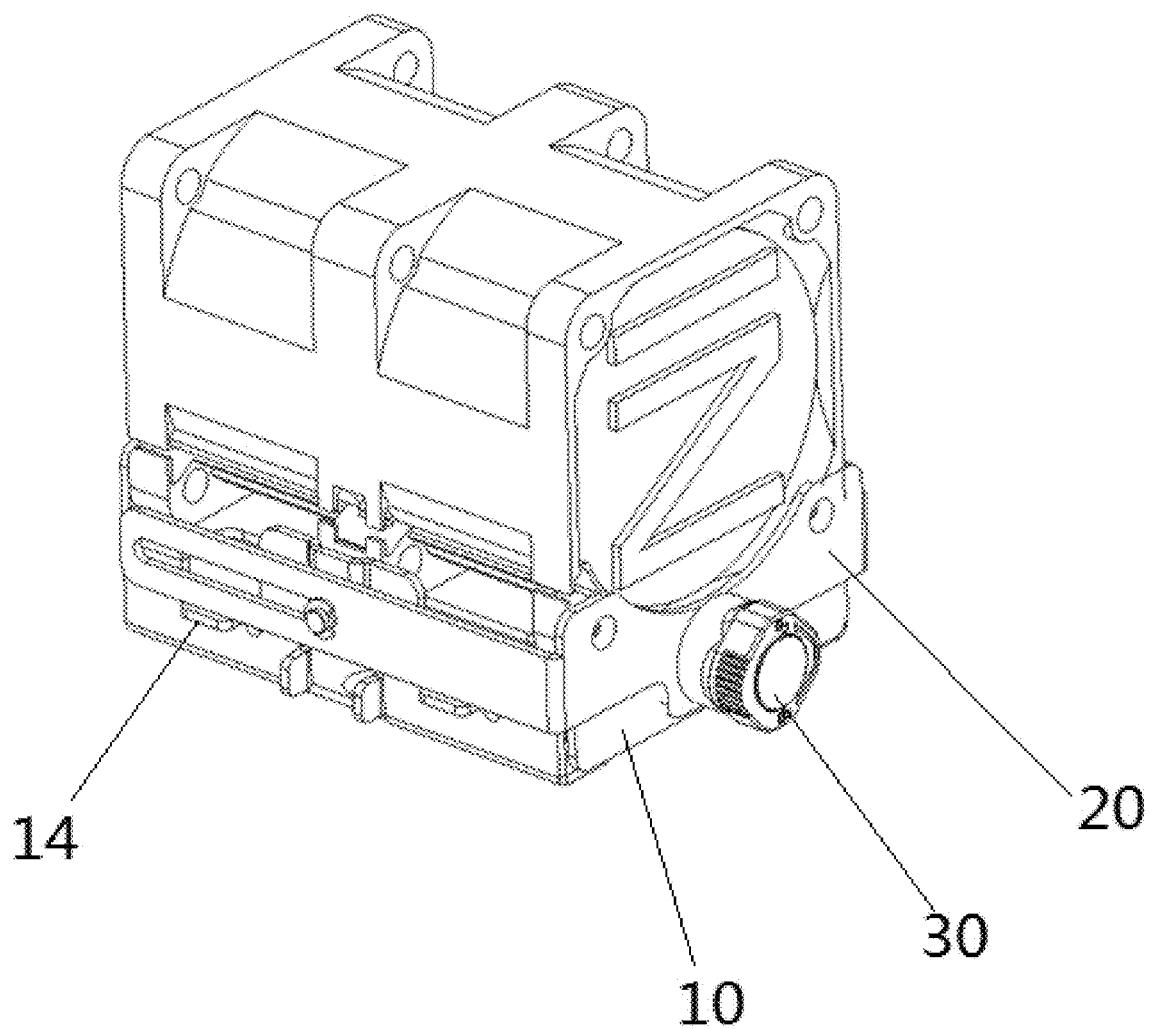
FIG. 9 is a schematic structural diagram when the flipping member in FIG. 1 has been translated to the locking state.

The flipping limiting component 14 according to the present embodiment employs a protruding boss, and the boss is located on the side of the longer side of the base 10 and outwardly protrudes. When the flipping member 20 has been flipped to the intermediate state, one end of the flipping member 20 can abut the boss, thereby preventing the flipping member 20 from continuously rotating, to realize the functions of limiting and positioning. Furthermore, the flipping limiting component 14 according to the present embodiment is plural, and on each of the two opposite sides in the circumferential direction of the rotation axis of the flipping member 20 is provided one flipping limiting component 14. In other words, on the side of one longer side at least two bosses are provided, and the present embodiment takes two as an example. The two bosses are located on the two sides of the connecting pin 12, and the heights are substantially equal, to form the form of boss-connecting pin 12-boss. Accordingly, when the flipping member 20 is in the locking state, because the flipping member 20 is required to be translated by a certain distance from the intermediate state to the locking state, the first section 22 of the flipping member 20 is simultaneously supported by the two bosses on the side of the longer side, as shown in FIG. 9. Accordingly, by using the relation between the two bosses and the first section 22, the limiting of the flipping is realized to a certain extent. Likewise, because two first sections 22 are provided, the sides of both of the two longer sides are provided with two bosses, thereby serving to limit both of the two first sections 22.

In the present embodiment, the locking component 30 comprises a lockout slot 31 and a lockout member 32. The lockout slot 31 is located on the side of the shorter side opposite to the first limiting component 11 of the base 10. The lockout member 32 is movably connected to the second section 23 of the flipping member 20. When the flipping member 20 is in the locking state, the lockout member 32 butts the lockout slot 31, and the lockout member 32 is located inside the lockout slot 31 and locks the relative position between the flipping member 20 and the base 10, to realize a quick lockout.

The lockout member 32 and the lockout slot 31 according to the present embodiment are of a shape-matching non-circular structure. When the flipping member 20 is in the locking state, the shapes of the lockout member 32 and the lockout slot 31 are aligned, the lockout member 32 is protruded into the lockout slot 31, and the lockout member 32 is rotated to be limiting-fitted to the lockout slot 31. Particularly, the lockout slot 31 in the lockout face is configured to be a rectangular hole. The lockout member 32 on the second section 23 of the flipping member 20 is provided with a rotation shaft and a blocking member nested to the rotation shaft, and the blocking member and the rotation shaft are synchronously rotated. The blocking member has a longer wing having a length greater than the width of the rectangular hole of the lockout slot 31 and a shorter wing having a width less than the width of the rectangular hole, and, with the above precondition, the length of the longer wing of the blocking member is less than the length of the rectangular hole. When the rotation shaft has been rotated by a suitable angle to cause the direction of the longer wing of the blocking member and the length direction of the rectangular hole to be aligned, while the flipping member 20 is being horizontally moved to be switched from the intermediate state to the locking state, the blocking member enters the lockout slot 31. The rotation shaft is subsequently rotated by a suitable angle, so that the direction of the longer wing of the blocking member is perpendicular to the length direction of the rectangular hole. On that basis, the flipping member 20 cannot complete the horizontal movement relative to the base 10; in other words, the flipping member 20 is locked in the locking state.

In the present embodiment, the locking component 30 of the fan installing mechanism further comprises a rotary knob 33. The rotary knob 33, via the rotation shaft of the lockout member 32, is synchronously rotatably connected to the blocking member of the lockout member 32, and the lockout member 32 and the rotary knob 33 are located at the inner face and the outer face of the side wall of the flipping member 20 respectively. Particularly, the rotary knob 33 is connected to the blocking member by the rotation shaft, and, by rotation of the rotary knob 33, the pose of the blocking member is adjusted, to finally reach the purpose of locking and unlocking the fan installing mechanism.

As shown in FIG. 3, in the present embodiment, a connecting hole 15 is provided at the bottom of the base 10, and the base 10 is connected to an external installation frame by the connecting hole 15. Moreover, as shown in FIGS. 2 and 5, the quantities of the first limiting component 11 and/or the second limiting component 21 may also be configured correspondingly according to demands, and may be one or more. When they are plural, the first limiting components 11 or the second limiting components 21 are arranged separately along the surface where the first limiting components 11 or the second limiting components 21 are located. In the present embodiment, two first limiting components 11 and two second limiting components 21 are provided, and the first limiting components 11 and the second limiting components 21 correspond one to one, and correspond to the mounting holes in the fan.

In the present embodiment, in the sequence of FIGS. 6 to 9, the process of installing the fan to the fan installing mechanism is as follows. In the installation of the fan, firstly it is required to ensure that the flipping member 20 is in the avoiding state. In the avoiding state, the length direction of the first sections 22 of the flipping member 20 is perpendicular to the upper surface of the base 10, and the first sections 22 of the flipping member 20 are located inside the limiting directing components 13 on the sides of the two longer sides. When it is ensured that the flipping member 20 is in the avoiding state, the pose of the fan is adjusted, whereby the direction of extension of the mounting holes of the fan is parallel to the direction of extension of the protruding-column structures of the first limiting components 11, and one of the rectangular side faces of the fan is parallel to the upper surface of the base 10. After the pose of the fan has been adjusted, the position of the fan is adjusted, whereby two openings of the fan that are closer to the upper surface are aligned with the protruding-column structures of the first limiting components 11 on the base 10. Subsequently, the fan is horizontally moved, whereby the protruding-column structures of the first limiting components 11 are inserted into the mounting holes of the fan, and the end face of the fan where the mounting holes are located and the fixing face where the first limiting components 11 are located completely abut. In the above-described process, the end face of the fan that abuts the fixing face passes through between the flipping member 20 and the base 10, and the fan is finally located within the installation region between the flipping member 20 and the base 10. After the fan has been in place, the flipping member 20 is lifted, whereby the first sections 22 of the flipping member 20 move along the directing channels 131, till they have exited from the directing channels 131. Subsequently, the flipping member 20 is downwardly rotated, and, by the effect of the flipping limiting components 14, the flipping member 20 is finally rotated by 90 degrees as compared with the original avoiding state and reaches the intermediate state. When the flipping member 20 is in the intermediate state, its first sections 22 are parallel to the upper surface of the base 10, and the protruding-column structures of the second limiting components 21 on the second section 23 are aligned with two mounting holes of the end face of the fan. After the intermediate state has been reached, firstly the pose of the blocking member of the lockout member 32 is determined, and, by rotating the rotary knob 33 to drive the blocking member to rotate via the rotation shaft, the pose of the blocking member is adjusted, whereby the direction of extension of the longer wing of the blocking member is parallel to the length direction of the lockout slot 31. After the pose of the blocking member has been adjusted, the flipping member 20 is pushed to horizontally move to approach the base 10, the blocking member on the second section 23 of the flipping member 20 enters the space behind the lockout slot 31, and finally the second section 23 of the flipping member 20 abuts the side of the shorter side of the base 10. Subsequently, the rotary knob 33 is rotated, to drive the blocking member to rotate to adjust the pose of itself, whereby the direction of extension of the longer wing of the blocking member is parallel to the width direction of the lockout slot 31. After such a pose adjustment, the blocking member cannot exit from the lockout slot 31, the flipping member 20 is fixed to the base 10, and the locking of the fan by the locking component 30 is finally completed. In the above-described movement of the flipping member 20 approaching the base 10, the protruding-column structures of the second limiting components 21 on the flipping member 20 are aligned with and inserted into the mounting holes in the corresponding end face of the fan.

In the present embodiment, the process of detaching the fan from the fan installing mechanism is as follows. Firstly, the rotary knob 33 is rotated to drive the blocking member of the lockout member 32 to rotate to adjust the pose of itself, whereby the direction of extension of the longer wing of the blocking member is parallel to the length direction of the rectangular hole. After the pose of the blocking member has been adjusted, the flipping member 20 is pulled to horizontally move in the direction away from the base 10. In the process of the flipping member 20 horizontally leaving the base 10, the blocking member exits from the lockout slot 31, the protruding-column structures of the second limiting components 21 on the flipping member 20 exit from the corresponding mounting holes in the fan, and finally the flipping member 20 is switched from the original locking state to the intermediate state. After the flipping member 20 has completed the switching from the locking state to the intermediate state, the flipping member 20 is upwardly rotated by 90°, whereby the length direction of the first sections 22 of the flipping member 20 is the vertical direction, to finally cause the flipping member 20 to be switched from the intermediate state to the avoiding state. When the flipping member 20 is in the avoiding state, the fan may horizontally move relative to the base 10. During such movement, the protruding-column structures of the first limiting components 11 exit from the corresponding mounting holes of the fan, the fan is finally disengaged from the fan installing mechanism, and the detachment is completed.

The Second Embodiment

The difference from the first embodiment is that the mode of the fitting between the first section 22 and the base 10 is different.

In the present embodiment, the first section 22 and the protruding section still employ the mode of the fitting between a chute 221 and a pin roll. However, in the present embodiment, the chute 221 is provided on the base 10, and the connecting pin 12 is provided on the first section 22 of the flipping member 20. The connecting pin 12 is still provided inside the chute 221 and can be rotated and translated relative to the chute 221. Taking into consideration that, in this case, the I-shaped chute 221 cannot realize the rotation, the chute 221 according to the present embodiment may, according to demands, be a cross-shaped or X-shaped slot and so on. Taking a cross-shaped chute 221 as an example, the cross-shaped chute 221 may be considered as two chutes 221 that are perpendicular and intersect, wherein one of the two chutes 221 is horizontal, and the other is vertical. Accordingly, when the flipping member 20 is moving in the vertical direction and the horizontal direction, essentially the connecting pin 12 is translating in the two chutes 221 that are perpendicular and intersect.

Certainly, the particular structure of the fitting between the flipping member 20 and the base 10 is not limited to the modes according to the above embodiments of the present application, and other structural forms may also be employed according to demands, provided that the translation and the relative rotation can be realized.

The Third Embodiment

The difference from the first embodiment is that the flipping member 20, the limiting directing component 13 and the flipping directing component are different.

In the present embodiment, merely one first section 22 of the flipping member 20 is provided, whereby the flipping member 20 forms an overall structure of an L shape. In this case, the flipping member 20 can still realize the relevant function in the first embodiment. Moreover, because merely a single side of the base 10 is provided with the first section 22, the limiting directing component 13 and the flipping directing component also may be provided on the single side; in other words, merely the side of the longer side of the base 10 that is provided with the first section 22 is provided with the limiting directing component 13 and the flipping directing component. That may also realize the limitation on the mode of the rotation and the translation of the flipping member 20, and at the same time reduces the used components, which reduces the structural complexity, and reduces the cost on manufacturing and repairing.

It should be noted that the plurality in the above embodiments refers to "at least two".

It can be seen from the above description that the above embodiments of the present application realize the following technical effects:

The structure is simple, has a low cost of manufacturing and installation, and is convenient to repair.

The mechanism has a good versatility and a wide application scope, and the components are conveniently produced and replaced.

No large-scale metal framework is used, which saves the cost.

The fan installing mechanism realizes an open installation mode of the fan, and does not block the fan, which improves the performance of the heat dissipation of the server.

Apparently, the above-described embodiments are merely certain embodiments of the present application, rather than all of the embodiments. All of the other embodiments that a person skilled in the art obtains on the basis of the embodiments of the present application without paying creative work should fall within the protection scope of the present application.

It should be noted that the terms used herein are merely for the description on the particular embodiments, and are not intended to limit the exemplary embodiments of the present application. As used herein, unless explicitly stated otherwise in the context, the terms in the singular forms are intended to encompass the plural forms. Furthermore, it should also be understood that, when the term "comprise" and/or "include" is used in the description, it indicates the existence of a feature, a step, a process, a device, a component and/or a combination thereof.

It should be noted that the terms "first", "second" and so on in the description, the claims and the drawings of the present application are intended to distinguish similar objects, and are not necessarily used to describe a particular order or sequence. It should be understood that the data so used may be interchanged in suitable cases, whereby the embodiments of the present application described herein can be implemented in other sequences than those illustrated or described herein.

The above are merely preferable embodiments of the present application, and are not indented to limit the present application. For a person skilled in the art, the present application may have various modifications and variations. Any modifications, equivalent substitutions and improvements that are made within the spirit and the principle of the present application should fall within the protection scope of the present application.

The invention claimed is:

1. A fan installing mechanism, wherein the fan installing mechanism comprises:
    a base, wherein the base has a first limiting component for limiting movement of a fan;
    a flipping member, wherein the flipping member is rotatably connected to the base, and the flipping member has a second limiting component for limiting the movement of the fan, and has an avoiding state and a locking state; when the flipping member is in the avoiding state, the flipping member avoids a movement path of installation of the fan to the base, and the fan is capable of being limiting-fitted to the first limiting component; and when the flipping member is in the locking state, the flipping member is flipped relative to the base and the second limiting component is limiting-fitted to the fan, to hinder the fan from disengaging from the base; and
    a locking component, wherein the flipping member is provided between the base and the locking component, and when the flipping member is in the locking state, the locking component locks a position of the flipping member to the locking state;
    wherein the flipping member comprises a first section and a second section that are sequentially connected, the first section is rotatably and translatably connected to the base, and the second limiting component and/or the locking component are located at the second section;
    wherein the base has a limiting directing component, and the limiting directing component forms a directing channel;
    when the flipping member is in the avoiding state, the first section is located inside the directing channel, and the flipping member is merely capable of translating along a direction of extension of the directing channel; and
    when the first section has exited from the directing channel, the flipping member is capable of being flipped to switch the states.

2. The fan installing mechanism according to claim 1, wherein when the flipping member is in the locking state, the first limiting component and the second limiting component are located on two opposite sides and/or neighboring sides of the fan.

3. The fan installing mechanism according to claim 1, wherein the flipping member and the base are rotatable and translatable relative to each other, and the flipping member further has an intermediate state between the avoiding state and the locking state;
    while the flipping member is being switched from the avoiding state to the intermediate state, the flipping member is flipped relative to the base; and
    while the flipping member is being switched from the intermediate state to the locking state, the flipping member is translated relative to the base.

4. The fan installing mechanism according to claim 3, wherein a flipping axis of the flipping member and a trajectory line of the translation of the fan to the base are not parallel to each other, and a translation trajectory line of the switching of the flipping member from the intermediate state to the locking state and the trajectory line of the translation of the fan to the base are not perpendicular to each other.

5. The fan installing mechanism according to claim 4, wherein the flipping axis of the flipping member and the trajectory line of the translation of the fan to the base are perpendicular to each other, and the translation trajectory line of the switching of the flipping member from the intermediate state to the locking state and the trajectory line of the translation of the fan to the base are parallel to each other.

6. The fan installing mechanism according to claim 3, wherein a connecting line between the first limiting component and the second limiting component and a translation trajectory line of the switching of the flipping member from the intermediate state to the locking state are parallel to each other.

7. The fan installing mechanism according to claim 1, wherein each of the first limiting component and the second limiting component is of a protruding-column structure, and axes of the protruding-column structures are parallel to a surface of the base.

8. The fan installing mechanism according to claim 1, wherein one of the first section and the base is provided with a chute, the other of the first section and the base is provided with a connecting pin, the connecting pin is located inside the chute, and the connecting pin and the chute are translatable relative to each other and rotatable relative to each other.

9. The fan installing mechanism according to claim 8, wherein the connecting pin and the first limiting component are located on neighboring sides of the base.

10. The fan installing mechanism according to claim 1, wherein the first section is a plurality of first sections, and each of two ends of the second section is connected to one instance of the first sections, whereby the flipping member is of a structure of a shape of a rectangle without one side.

11. The fan installing mechanism according to claim 1, wherein the base has a flipping limiting component, and the flipping limiting component is located in a rotation path of the flipping of the flipping member; and
when the flipping member has been flipped and switched to the locking state, the flipping member and the flipping limiting component stop each other, to control a flipping angle of the flipping member.

12. The fan installing mechanism according to claim 11, wherein the flipping limiting component is a plurality of flipping limiting components, and on each of two opposite sides in a circumferential direction of a rotation axis of the flipping member is provided one instance of the flipping limiting components; and
when the flipping member is in the locking state, the flipping member is stopping-fitted to both of the flipping limiting components on the two sides.

13. The fan installing mechanism according to claim 1, wherein the second limiting component and the locking component are located on a same one side of the base.

14. The fan installing mechanism according to claim 1, wherein the locking component comprises:
a lockout slot, wherein the lockout slot is located on the base; and
a lockout member, wherein the lockout member is movably connected to the flipping member; and when the flipping member is in the locking state, the lockout member butts the lockout slot, and the lockout member is located inside the lockout slot and locks a relative position between the flipping member and the base.

15. The fan installing mechanism according to claim 14, wherein the lockout member and the lockout slot are of a shape-matching non-circular structure; and
when the flipping member is in the locking state, shapes of the lockout member and the lockout slot are aligned, the lockout member is protruded into the lockout slot, and the lockout member is rotated to be limiting-fitted to the lockout slot.

16. The fan installing mechanism according to claim 14, wherein the locking component further comprises a rotary knob, the rotary knob and the lockout member are connected and synchronously rotated, and the lockout member and the rotary knob are located at an inner face and an outer face of a side wall of the flipping member respectively.

17. The fan installing mechanism according to claim 1, wherein
the flipping member is of a structure of a shape of a rectangle without one side, two ends of the structure of a shape of a rectangle without one side are rotatably and translatably connected to two sides of the base; when the flipping member is in the avoiding state, a plane where the structure of a shape of a rectangle without one side is located is perpendicular to an installation surface of the base; and when the flipping member is in the locking state, the plane where the structure of a shape of a rectangle without one side is located is parallel to the installation surface of the base;
the flipping member further has an intermediate state between the avoiding state and the locking state; while the flipping member is being switched from the avoiding state to the intermediate state, the flipping member is flipped relative to the base; and while the flipping member is being switched from the intermediate state to the locking state, the flipping member is translated relative to the base; and
the base has a flipping limiting component, and the flipping limiting component is located in a rotation path of the flipping of the flipping member; and when the flipping member has been flipped and switched to the intermediate state and the locking state, the flipping member and the flipping limiting component stop each other, to control a flipping angle of the flipping member.

18. A server, wherein the server comprises a fan and the fan installing mechanism according to claim 1, and the fan is installed to the fan installing mechanism.

* * * * *